(12) United States Patent
Shingubara et al.

(10) Patent No.: US 7,022,598 B2
(45) Date of Patent: Apr. 4, 2006

(54) METHOD OF PRODUCING MULTILAYER INTERCONNECTION STRUCTURE

(75) Inventors: Shoso Shingubara, Higashi-Hiroshima (JP); Takayuki Takahagi, Aki-gun (JP); Zenglin Wang, Higashi-Hiroshima (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 10/870,942

(22) Filed: Jun. 21, 2004

(65) Prior Publication Data

US 2005/0009334 A1 Jan. 13, 2005

(30) Foreign Application Priority Data

Jul. 7, 2003 (JP) ............................... 2003-271336

(51) Int. Cl.
*H01L 21/4763* (2006.01)
(52) U.S. Cl. ...................... 438/618; 438/678; 438/785; 438/680; 438/674; 438/650
(58) Field of Classification Search ................ 438/678, 438/618, 785, 680, 674, 650, 620, 622, 626, 438/627, 628, 637, 643, 686
See application file for complete search history.

(56) References Cited

U.S. PATENT DOCUMENTS 5,834,367 A * 11/1998 Otsuka et al. ............... 438/618
6,764,585 B1   7/2004 Matsuda et al.
6,852,635 B1 *  2/2005 Satta et al. ................. 438/704
2005/0001325 A1 *  1/2005 Andricacos et al. ........ 257/762

FOREIGN PATENT DOCUMENTS

| JP | 7-50275 A | 2/1995 |
| JP | 2000-183160 A | 6/2000 |
| JP | 2002-141305 A | 5/2002 |

OTHER PUBLICATIONS

S. Shingubara, T. Ida, H. Sawa, H. Sakaue, and T. Takahagi: "Effect of Pd Catalyst Adsorption on Cu Filling Characteristics in Electroless Plating", Advanced Metallization Conference 2000, Mat. Res. Sci. Conf. Proc. ULSI-XVI (2001), pp. 229-234.

(Continued)

*Primary Examiner*—B. William Baumeister
*Assistant Examiner*—Victor V. Yevsikov
(74) *Attorney, Agent, or Firm*—Nixon & Vanderhye, P.C.

(57) ABSTRACT

A method of producing a buried-type multilayer interconnection structure is provided. The method comprises steps of: forming a hole portion in an insulating layer; forming a catalyst layer having average film thickness from 0.2 nm to 10 nm on a surface of the hole portion by a physical vapor deposition method; forming an electroless plating layer on the surface of the hole portion by an electroless plating method using the catalyst layer as a catalyst; and burying up the hole portion with an electrolytic plating layer by an electrolytic plating method using the electroless plating layer as a seed layer.

14 Claims, 5 Drawing Sheets

OTHER PUBLICATIONS

Z. Wang, T. Ida, H. Sakaue, S. Shingubara and T. Takahagi "Electroless Plating of Copper on Metal-Nitride Diffusion Barriers Initiated Displacement Plating" Electrochemical and Solid-State Letters, 6 (3) C38-C41 (2003).

Zenglin Wang, Osamu Yaegashi, Hiroyuki Sakaue, Takayuki Takahagi, and Shoso Shingubara "Suppression of native oxide growth in sputtered TaN films and its application to Cu electroless plating" Journal of Applied Physics, Oct. 1, 2003 p4697-4701.

Zenglin Wang, Hiroyuki Sakaue, Shoso Shingubara and Talayuki Takahagi "Influence of Surface Oxide of Sputtered TaN on Displacement Plating of Cu" Jpn. Appl. Phys. vol. 42 (2003) pp. 1843-1846.

Zenglin Wang, Osamu Yaegashi, Hiroyuki Sakaue, Talayuki Takahagi and Shoso Shingubara "Highly Adhesive Electroless Cu Layer Formation Using an Ultra Thin Ionized Cluster Beam (ICB)-Pd Catalytic Layer for Sub-100nm Cu Interconnections" Jpn. J. Appl. Phys. vol. 42(2003) pp. L1223-L1225.

* cited by examiner

METHOD OF PRODUCING MULTILAYER INTERCONNECTION STRUCTURE

CROSS-REFERENCE TO RELATED APPLICATION

The disclosure of Japanese Patent Application No. 2003-271336 filed on Jul. 7, 2003 including specification, drawings and claims is incorporated herein by reference in its entirely.

BACKGROUND OF THE INVENTION

1. Field of the Invention

The present invention relates to a method of producing a buried-type multilayer interconnection structure, and more particularly, to a method of producing a buried-type multilayer interconnection structure by a physical vacuum deposition method.

2. Description of the Related Art

A method of producing a buried copper interconnection by a conventional Damascene process requires that after a barrier metal layer of TaN or the like is formed within a via hole, a seed layer is formed on the barrier metal layer, and the via hole is buried up by electroless plating which uses the seed layer (JP, 2000-336486, A, S. Shingubara, T. Ida, H. Sawa, H. Sakaue, and T. Takahaghi: "Effect of Pd Catalyst Adsorption on Cu Filling Characteristics in Electroless Plating," Advanced Metallization Conference 2000, Mat. Res. Sci. Conf. Proc. ULSI-XVI (2001), pp. 229–234).

FIGS. 5A–5D show cross sectional views of steps of producing a conventional buried copper interconnection. These steps include the following steps 1–4.

Figure 5A:
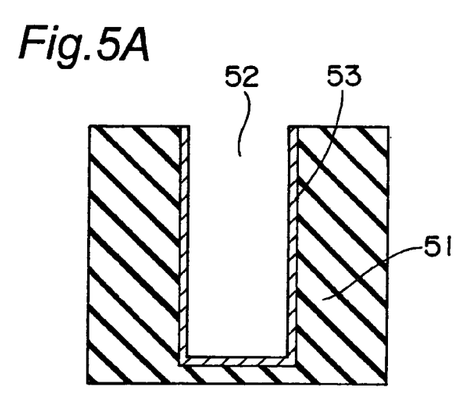
FIGS. 5A–5D show cross sectional views of steps of producing a conventional buried interconnection.

Step 1: As shown in FIG. 5A, a hole portion 52 is formed in an interlayer insulating film 51 of silicon oxide for instance, following which a barrier metal layer 53 of TaN or the like is formed on a surface of the hole portion 52 by a sputtering method.

Figure 5B:
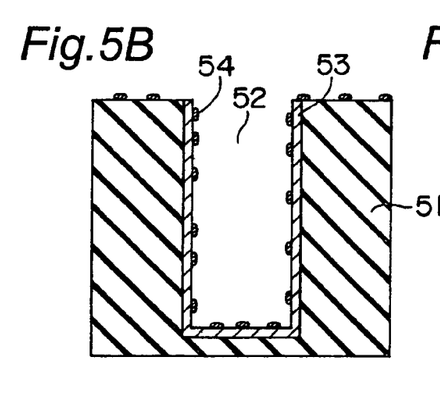

Step 2: As shown in FIG. 5B, after tin is adsorbed on a surface of the barrier metal layer 53 or the like by a wet method using a tin chloride solution, tin is substituted with palladium using a palladium chloride solution and palladium (Pd) colloid particles 54 are adsorbed (wet method).

Figure 5C:
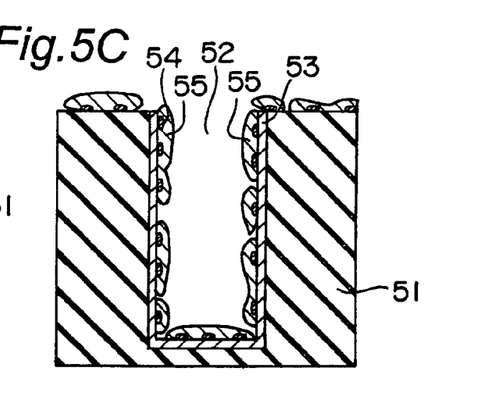

Step 3: As shown in FIG. 5C, by electroless plating which uses the palladium colloid particles 54 as a catalyst, a seed layer 55 of Cu whose film thickness is about 10 nm is formed.

Figure 5D:
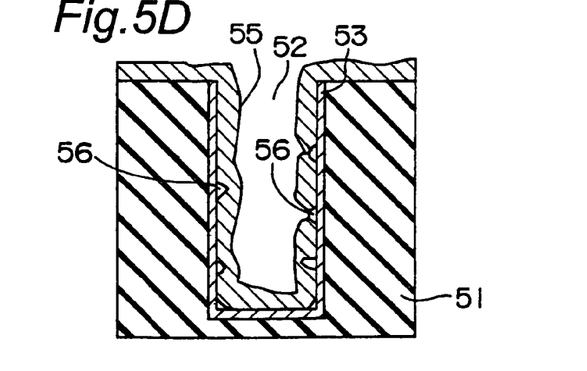

Step 4: As shown in FIG. 5D, as the seed layer 55 of Cu is formed through electroless plating, the seed layer 55 is formed also within the hole portion 52 which has a large aspect ratio. Following this, by electrolytic plating which uses the seed layer 55, the hole portion 52 is buried up with Cu and a buried interconnection is therefore obtained (not shown).

SUMMARY OF THE INVENTION

However, when the palladium colloid particles 54 are formed by a wet method, the palladium colloid particles 54 are adsorbed as they are away from each other on the surface of the hole portion 52 at a low adsorption density. Because of this, when the seed layer 55 is formed thin by electroless plating which uses the palladium colloid particles 54 as a catalyst, a void 56 shown in FIG. 5D is formed in the seed layer 55. Specifically, since it is not possible to form the seed layer 55 as thin as 10 nm or thinner without giving rise to the void 56, this wet method cannot be used when a very fine buried interconnection having the line width of 100 nm or less is desired.

An object of the present invention is to bury a via hole or the like in a highly-integrated micro-pattern and accordingly provide a buried-type multilayer interconnection structure having a low electric resistivity.

Through intensive research, the inventors of the present invention found that when a catalyst layer is formed as a result of adsorption of palladium cluster particles by a physical vacuum deposition method, a thin seed layer is obtained without forming a void and that control of the average film thickness of the catalyst layer prevents the electric resistivity of a buried interconnection from rising high.

The present invention is directed to a method of producing a buried-type multilayer interconnection structure, comprising: a step of forming a hole portion in an insulating layer; a deposition step of forming a catalyst layer having average film thickness from 0.2 nm to 10 nm on a surface of the hole portion by a physical vacuum deposition method, or of forming a catalyst layer on a surface of the hole portion by a physical vacuum deposition method such that the catalyst layer has the average film thickness up to 10 nm and down to the thickness of one-atom layer of atoms of the material of which the catalyst layer is made; a step of forming an electroless plating layer on the surface of the hole portion by an electroless plating method which utilizes the catalyst layer as a catalyst; and a burying step of burying up the hole portion with an electrolytic plating layer by an electrolytic plating method using the electroless plating layer as a seed layer.

The average film thickness of the catalyst layer is preferably equal to or thinner than 5 nm.

The catalyst layer is preferably made of one material selected from the group consisting of palladium, platinum and gold.

The deposition step is a step at which cluster particles having the diameters of 10 nm or smaller preferably, or 5 nm or smaller more preferably, are adsorbed on the surface of the hole portion by a cluster ion beam method.

Prior to the deposition step, there may be a step of forming on the surface of the hole portion a barrier metal layer which is mainly made of a material selected from the group consisting of TaN, WN and TiN.

After the burying step, there may be a step of heating the multilayer interconnection structure at a temperature from 200° C. to 450° C.

DETAILED DESCRIPTION OF THE PREFERRED EMBODIMENTS

FIGS. 1A–1F show cross sectional views of steps of producing a buried interconnection, generally denoted at 100, according to a preferred embodiment (Damascene process) These producing steps include the following steps 1–6.

Figure 1A:
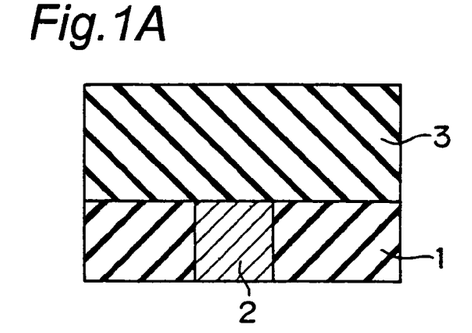
FIGS. 1A–1F show cross sectional views of steps of producing the buried interconnection according to the preferred embodiment of the present invention.

Step 1: As shown in FIG. 1A, a lower interconnection layer 2 of copper for example is formed in an interlayer insulating film 1 of silicon oxide for instance. An interlayer insulating film 3 of silicon oxide or the like is thereafter formed, covering the lower interconnection layer 2.

Figure 1B:
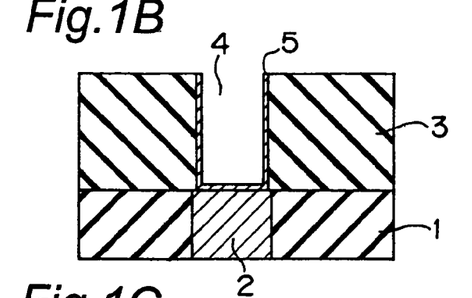

Step 2: As shown in FIG. 1B, the interlayer insulating film 3 is etched, thereby forming a hole portion 4. Following this, on a surface of the hole portion 4, a barrier metal layer 5 of TaN is formed by a sputtering method for example. A material mainly containing TaN, WN or TiN may be used for the barrier metal layer 5.

Figure 1C:
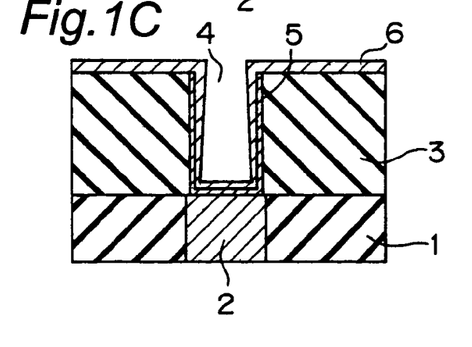

Step 3: As shown in FIG. 1C, by a highly-directional physical vacuum deposition method, a catalyst layer 6 formed by Pd cluster particles is adsorbed on the interlayer insulating film 3 and the barrier metal layer 5. More specially, by a cluster ion beam method, clustered Pd is supplied and adsorbed as cluster particles on the interlayer insulating film 3 and the barrier metal layer 5. As a result, on the interlayer insulating film 3 and the barrier metal layer 5, the catalyst layer 6 formed by Pd cluster particles (ICB—Pd) having the diameters of about 10 nm or less, or more preferably, about 5 nm or less is formed. In FIGS. 1A–1F, for the convenience of illustration, the catalyst layer 6 formed by multiple of cluster particles is shown as a layer.

Figure 2:
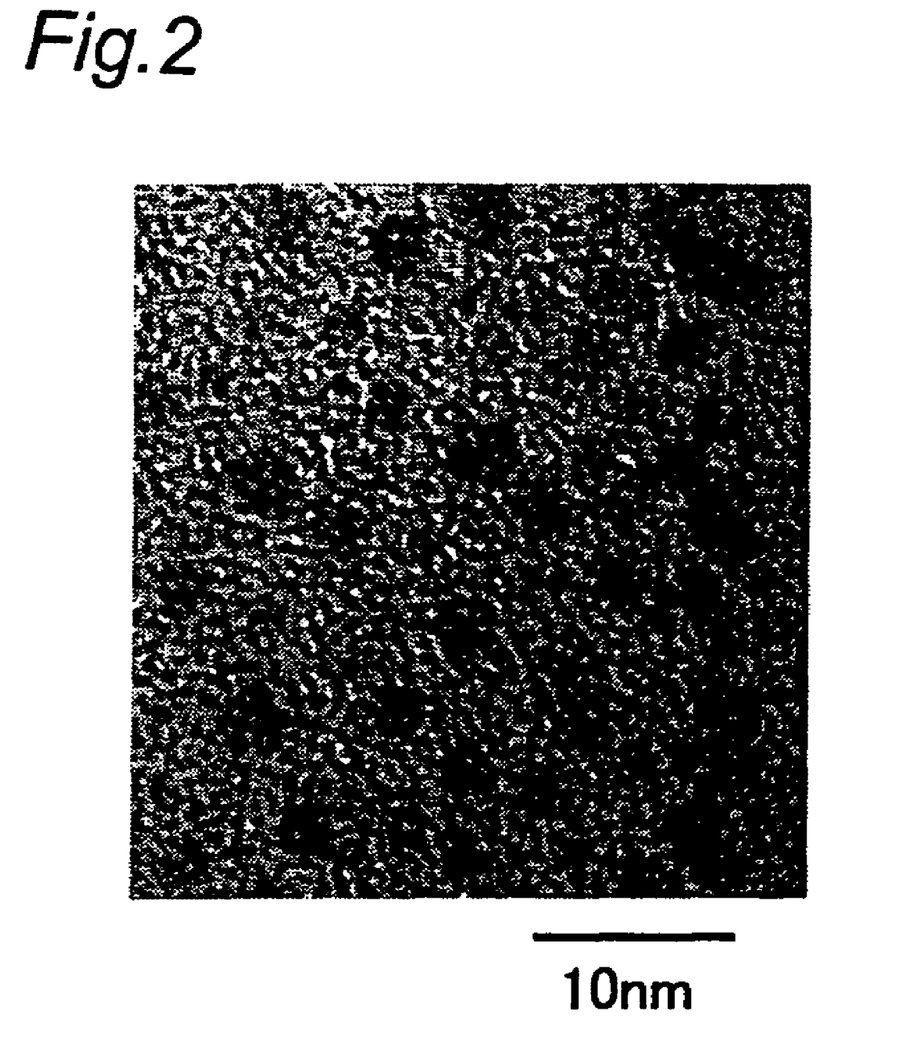
FIG. 2 is a TEM photograph of the palladium colloid particles formed on the barrier metal layer at the sidewall of a via hole.

FIG. 2 is a TEM photograph of Pd cluster particles (ICB—Pd) which are formed on the barrier metal layer 5 which is located at the side walls of the hole portion 4. As shown in FIG. 2, the barrier metal layer 5 seats the catalyst layer 6 formed by multiple of Pd cluster particles whose diameters range from about 2 to 5 nm. The average diameter of the cluster particles is about 3 nm. The cluster particles are away from each other by an average distance of about 10 nm or shorter. In other words, the adsorption density of the cluster particles is approximately three particles in an area of 10 nm by 10 nm. The adsorption density referred to here is the number of cluster particles adsorbed within a predetermined surface area.

The adsorption density of the Pd cluster particles is controlled such that the film thickness (average film thickness) as it is when the cluster particles are stretched into a layer whose thickness is uniform becomes preferably from about 0.2 nm to about 20 nm, or more preferably, from about 0.5 nm to about 5 nm. The minimum average film thickness is about the same as the thickness of one-atom layer of the material which is used as the catalyst. For example, where three Pd cluster particles whose average diameter is approximately 3 nm are adsorbed in an area of 10 nm by 10 nm, the average film thickness is about 0.35 nm. This is thicker than the film thickness of one-atom layer of Pd atoms (having the (100)-orientation) which is 0.195 nm.

Although the foregoing has described that a cluster ion beam method is used as a physical vacuum deposition method, other deposition method may be used instead such as a sputtering method, a vacuum evaporation method, an MBE method and an electron beam evaporation method. Deposition methods which use a high-ionized particle beam, such as a high ionization rate sputtering (IMP) method and a cluster ion beam method, are particularly preferable.

Figure 1D:
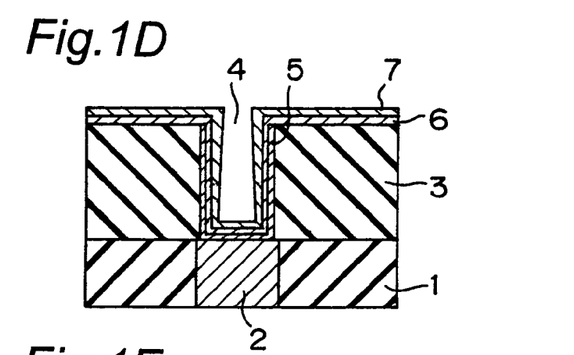

Step 4: As shown in FIG. 1D, by electroless plating which uses a copper sulfate solution for example, an electroless plating layer (seed layer) 7 is formed on the catalyst layer 6. The film thickness of the electroless plating layer 7 is about 10 nm or thinner. As described above, as the catalyst layer 6 is formed by a physical vapor deposition method, the adsorption density of the Pd cluster particles becomes high. Hence, even when the electroless plating layer 7 is formed as thin as 10 nm or thinner, no void is formed and a favorable continuous film is therefore obtained.

Figure 1E:
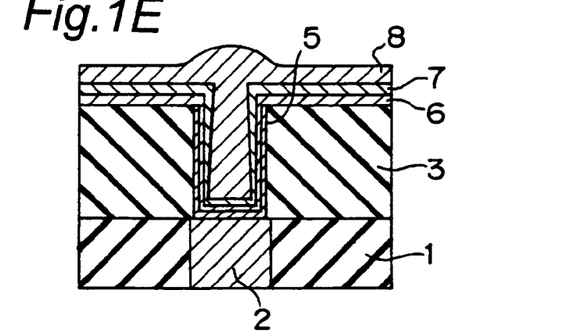

Step 5: As shown in FIG. 1E, by electrolytic plating which uses the electroless plating layer 7 as a seed layer, an electrolytic plating layer 8 of copper is formed which buries up the hole portion 4.

Figure 1F:
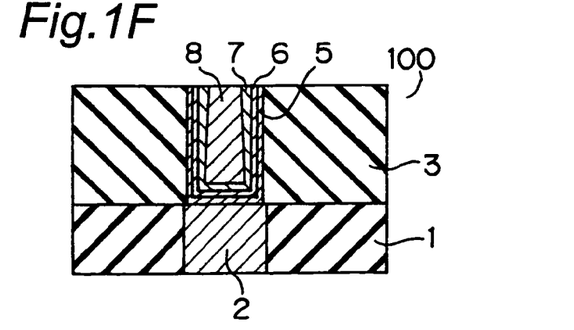

Step 6: As shown in FIG. 1F, this is then kept at a temperature from about 200° C. to about 450° C. for a few minutes to a couple dozens of minutes in a nitrogen atmosphere for instance for heating. The heating improves the adhesion of the barrier metal layer 5 with the electroless plating layer 6 or the like. At last, by a CMP method, the catalyst layer 6, the electroless plating layer 7 and the electrolytic plating layer 8 are removed, whereby the buried interconnection generally denoted at 100 is obtained.

Figure 3:
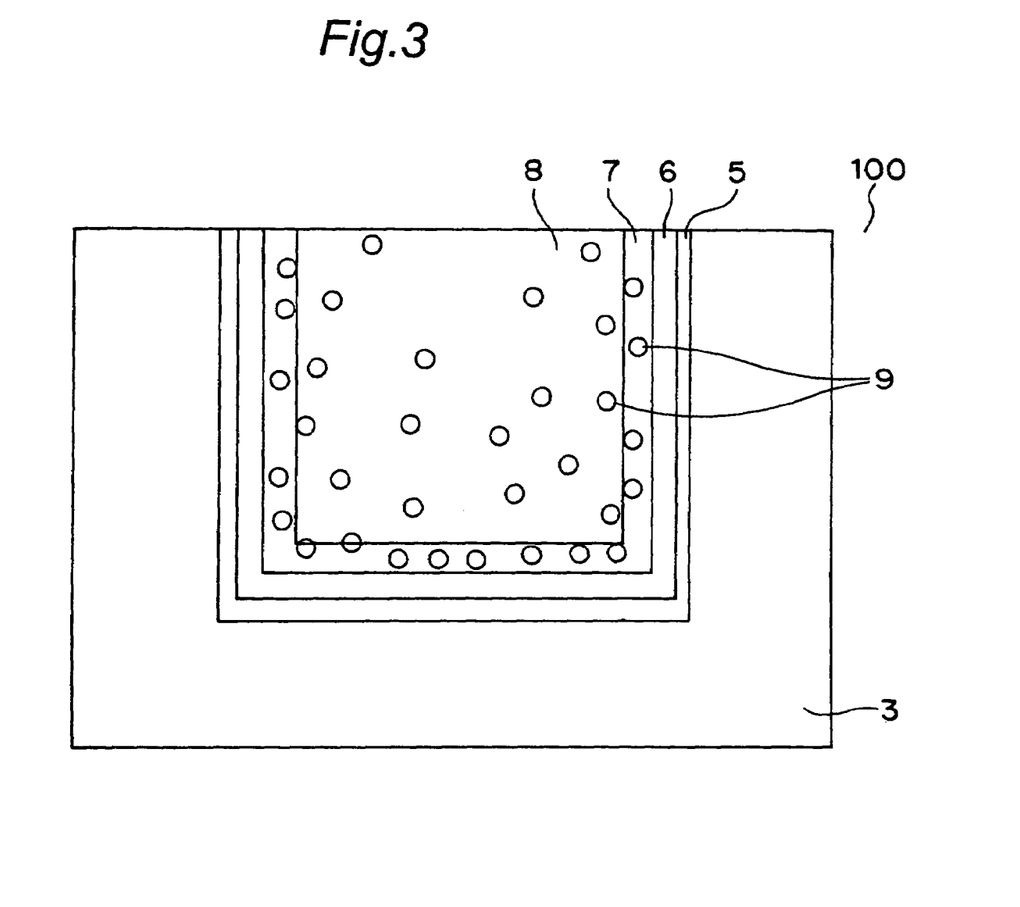
FIG. 3 is a cross sectional view of the buried interconnection according to the preferred embodiment of the present invention.

The electric resistivity of the buried interconnection eventually formed in this manner becomes high in some cases as a result of the heating. FIG. 3 is a schematic cross sectional view of a buried interconnection whose electric resistivity has thus rose because of heating. In FIG. 3, the same reference symbols as those in FIGS. 1A–1F denote the same or corresponding portions. As shown in FIG. 3, in the case of the buried interconnection having the high electric resistivity, Pd atoms 9 are dissolved and diffused from the catalyst layer 6 formed by Pd cluster particles into the electroless plating layer 7 and the electrolytic plating layer 8. The Pd atoms 9 within the electroless plating layer 7 and the electrolytic plating layer 8 function as scatterers to conduction electrons. Since a electric resistivity is dependent upon the degree at which dissolved and diffused impurities such as Pd scatter conduction electrons, and therefore, the larger the amount of dissolved and diffused Pd atoms 9 is, the higher the electric resistivity becomes.

Figure 4:
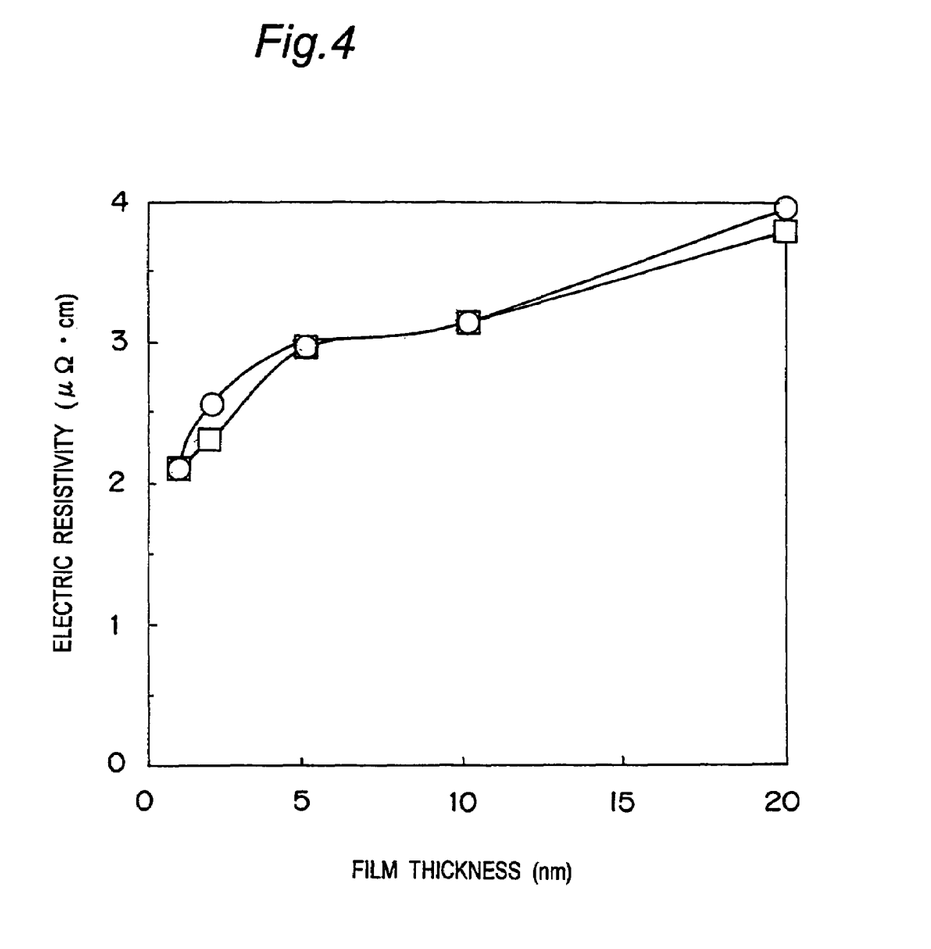
FIG. 4 shows the relationship between the average film thickness of the catalyst layer and the electric resistivity of the buried interconnection.

FIG. 4 is a graph which shows a relationship between the average film thickness of the catalyst layer 6 and the electric resistivity of the buried interconnection in the copper buried interconnection 100 which is obtained according to the method of the present invention. The horizontal axis represents the average film thickness of the catalyst layer, while the vertical axis represents the electric resistivity of the buried interconnection. The symbol □ denotes the pre-annealing electric resistivity and the symbol ○ denotes the post-annealing electric resistivity.

In the case of the buried interconnection 100, the electroless plating layer 7 having the film thickness of about 10 nm is formed, and using this as a seed layer, the hole portion 4 is buried up with the electrolytic plating layer 8. This is followed by heating at 300° C., after which the buried interconnection is formed by a CMP method. The line width of the buried interconnection (the width along the horizontal direction in FIG. 1F) is 0.5 μm.

Within the copper buried interconnection 100 which is formed according to the method of the present invention, in an area where the average film thickness of the catalyst layer 6 is 10 nm or thinner, the value of the electric resistivity shows almost no change before heating (the symbol □) and after heating (the symbol ○). On the other hand, more the average film thickness of the catalyst layer 6 exceeds 10 nm, the higher the post-heating electric resistivity becomes as compared to the pre-heating electric resistivity.

In this fashion, when the average film thickness of the catalyst layer is 10 nm or less, dissolution and diffusion of the Pd atoms caused by heating is prevented and the electric resistivity of the buried interconnection layer is prevented from rising.

In addition, as clearly shown in FIG. 4, regardless of before or after heating, the electric resistivity is approximately 3.0 μΩ·cm when the average film thickness of the catalyst layer 6 is 5 nm but is about 2.1 μΩ·cm when the average film thickness 1 nm. When the average film thickness is 1 nm, at the side walls of the hole portion where the aspect ratio (height/line width) is about 4, the average film thickness of the catalyst layer 6 is about the same as the thickness of a one-atom layer of Pd atoms.

Noting this, when the electric resistivity of the buried interconnection is 3 μΩ·cm or smaller, the buried interconnection can be used as an interconnection for an LSI, etc. Hence, as the average film thickness of the catalyst layer 6 is set to be about the same as the thickness of a one-atom layer or thicker but up to about 10 nm, or more preferably, about the same as the thickness of a one-atom layer or thicker but up to about 5 nm, the electric resistivity of the buried interconnection layer becomes 3 μΩ·cm or lower, thereby obtaining an interconnection layer which is applicable to an LSI, etc. In addition, when the average film thickness of the catalyst layer 6 is 10 nm or thinner as described above, the electric resistivity of the buried interconnection is prevented from rising.

Further, in this buried interconnection, since a very small amount of Pd is diffused in the electroless plating layer 7 and the electrolytic plating layer 8 which are made of copper, as compared to where the electroless plating layer 7 or the like made of pure copper (i.e., free of the very small amount of Pd), the reliability against electromigration is better by a couple of orders. The adhesion of the barrier metal layer 5 with the electroless plating layer 6 and the like also improves to be about the same or beyond the adhesion which is achieved when a copper film is formed by sputtering on the barrier metal layer 5.

If the average film thickness of the catalyst layer 6 becomes 1 nm or thinner, the adhesion between the electroless plating layer 7, the electrolytic plating layer 8 and the barrier metal layer 5 becomes insufficient, which will give rise to peeling at the CMP step (FIG. 1F).

Further, at the step 2 described above (FIG. 1B), the diameters of the Pd cluster particles adsorbed on the barrier metal layer 5 by a cluster ion beam method are from about 2 nm to about 4 nm, and the Pd cluster particles of these sizes exhibit favorable adhesion and an excellent characteristic as a catalyst for electroless plating. On the contrary, if the diameters of the Pd cluster particles grow beyond 10 nm, the continuity of the electroless plating layer 6 becomes poor and it becomes difficult to form the electroless plating layer 6 thin.

Although palladium is used as the material of the catalyst layer 6 in the preferred embodiment, platinum, gold or the like may be used instead.

As a catalyst layer is formed as a result of adsorption of Pd cluster particles by a physical vacuum deposition method and a thin seed layer is consequently formed without forming a void. In addition, the average film thickness of the catalyst layer is controlled, thereby preventing the specific resistance of the buried interconnection from rising.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A method of producing a buried-type multilayer interconnection structure, comprising:
    a step of forming a hole portion in an insulating layer;
    a deposition step of forming a catalyst layer having average film thickness from 0.2 nm to 10 nm on a surface of the hole portion by a physical vapor deposition method;
    a step of forming an electroless plating layer on the surface of the hole portion by an electroless plating method using the catalyst layer as a catalyst; and
    a burying step of burying up the hole portion with an electrolytic plating layer by an electrolytic plating method using the electroless plating layer as a seed layer.

2. The method according to claim 1, wherein the average film thickness of the catalyst layer is equal to or thinner than 5 nm.

3. The method according to claim 1, wherein the catalyst layer is made of one material selected from the group consisting of palladium, platinum and gold.

4. The method according to claim 1, wherein the deposition step is a step at which cluster particles having the diameters of 10 nm or smaller are adsorbed on the surface of the hole portion by a cluster ion beam method.

5. The method according to claim 1, wherein the deposition step is a step at which cluster particles having the diameters of 5 nm or smaller are adsorbed on the surface of the hole portion by a cluster ion beam method.

6. The method according to claim 1, wherein prior to the deposition step, a step is executed of forming on the surface of the hole portion a barrier metal layer which is mainly made of a material selected from the group consisting of TaN, WN and TiN.

7. The method according to claim 1, wherein after the burying step, a step is executed of heating the multilayer interconnection structure at a temperature from 200° C. to 450° C.

8. A method of producing a buried-type multilayer interconnection structure, comprising:
    a step of forming a hole portion in an insulating layer;
    a deposition step of forming a catalyst layer on a surface of the hole portion by a physical vapor deposition method such that the catalyst layer has the average film thickness up to 10 nm and down to the thickness of one-atom layer of atoms of the material of which the catalyst layer is made;
    a step of forming an electroless plating layer on the surface of the hole portion by an electroless plating method using the catalyst layer as a catalyst; and
    a burying step of burying up the hole portion with an electrolytic plating layer by an electrolytic plating method using the electroless plating layer as a seed layer.

9. The method according to claim 8, wherein the average film thickness of the catalyst layer is equal to or thinner than 5 nm.

10. The method according to claim 8, wherein the catalyst layer is made of one material selected from the group consisting of palladium, platinum and gold.

11. The method according to claim 8, wherein the deposition step is a step at which cluster particles having the diameters of 10 nm or smaller are adsorbed on the surface of the hole portion by a cluster ion beam method.

12. The method according to claim 8, wherein the deposition step is a step at which cluster particles having the diameters of 5 nm or smaller are adsorbed on the surface of the hole portion by a cluster ion beam method.

13. The method according to claim 8, wherein prior to the deposition step, a step is executed of forming on the surface of the hole portion a barrier metal layer which is mainly made of a material selected from the group consisting of TaN, WN and TiN.

14. The method according to claim 8, wherein after the burying step, a step is executed of heating the multilayer interconnection structure at a temperature from 200° C. to 450° C.

* * * * *